(12) United States Patent
Dawson et al.

(10) Patent No.: US 6,259,142 B1
(45) Date of Patent: *Jul. 10, 2001

(54) MULTIPLE SPLIT GATE SEMICONDUCTOR DEVICE AND FABRICATION METHOD

(75) Inventors: Robert Dawson, Austin; Mark I. Gardner, Cedar Creek; Frederick N. Hause; H. Jim Fulford, Jr., both of Austin; Mark W. Michael, Cedar Park; Bradley T. Moore; Derick J. Wristers, both of Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,837

(22) Filed: Apr. 7, 1998

(51) Int. Cl.[7] .................... H01L 29/76; H01L 29/94; H01L 29/788; H01L 31/062; H01L 21/336

(52) U.S. Cl. .................... 257/365; 257/318; 257/319; 257/341; 438/279; 438/283

(58) Field of Search ....................... 257/365, 366, 257/318, 319, 331, 341, 343; 438/283, 279, 284

(56) References Cited

U.S. PATENT DOCUMENTS

| | | | |
|---|---|---|---|
| 4,868,617 | 9/1989 | Chiao et al. ................. | 357/23.3 |
| 4,951,100 | 8/1990 | Parrillo ...................... | 357/23.3 |
| 5,012,315 | * 4/1991 | Shur ........................... | 357/23.14 |
| 5,091,763 | 2/1992 | Sanchez ...................... | 357/23.9 |
| 5,274,261 | 12/1993 | Chen .......................... | 257/344 |
| 5,510,648 | 4/1996 | Davies et al. ............... | 257/657 |
| 5,600,168 | * 2/1997 | Lee ............................. | 257/336 |
| 5,766,996 | * 6/1998 | Hayakawa et al. ......... | 438/257 |
| 5,793,089 | 8/1998 | Fulford, Jr. et al. ......... | 257/408 |
| 5,808,347 | 9/1998 | Kurimoto et al. ........... | 257/408 |

OTHER PUBLICATIONS

Wolf, S; Silicon Processing for the VLSI Era; vol. 2; Lattice Press, Sunset Beach, Ca.; 1990; pp. 188, 280.*

* cited by examiner

Primary Examiner—Carl Whitehead, Jr.
Assistant Examiner—Neal Berezny
(74) Attorney, Agent, or Firm—Skjerven Morrill MacPherson LLP; Ken J. Koestner

(57) ABSTRACT

A semiconductor integrated circuit having a multiple split gate is forming using a first polysilicon layer and a second polysilicon layer to form alternating first and second gate electrodes within an active area. The alternating gate electrodes are electrically isolated from one another by means of a gate insulating layer that is formed adjacent the side-walls of each firs gate electrode. Source and drain regions are formed adjacent the ends of the multiple split gate to define a channel region.

9 Claims, 5 Drawing Sheets

MULTIPLE SPLIT GATE SEMICONDUCTOR DEVICE AND FABRICATION METHOD

BACKGROUND OF THE INVENTION

1. Field of the Invention

The present invention relates in general to semiconductor integrated circuit device structures and associated methods of fabrication. More particularly, the invention pertains to semiconductor integrated circuits having transistors with multiple split gates.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the channel being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, polysilicon-Si or polysilicon) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally is attained by a corresponding decrease in the vertical dimensions. As IGFET vertical dimensions are reduced and the supply voltage remains nearly constant (e.g., 3V), the maximum channel electric field $\in_{ymax}$ near the drain tends to increase. If the electric field becomes strong enough, so-called hot-carrier effects may occur. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum channel electric field $\in_{ymax}$. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD with reduced parasitic resistance as well as a substantially planar top surface. It is especially desirable that the IGFET have a channel length that can be significantly smaller than the minimum resolution of the available lithographic system.

SUMMARY OF THE INVENTION

In accordance with multiple embodiments of the present invention, a transistor is formed having a multiple split gate structure. The multiple split gate structure is formed from alternating first and second gate electrodes, physically separated and mutually electrically isolated by an insulating layer formed adjacent side-walls of the first gate electrodes. Source and drain regions of the transistor are formed adjacent the outermost portions of the multiple split gate.

In some embodiments of the present invention, an even number of first gate electrodes are formed, each pair of first electrodes having a space between them. A second gate layer is deposited, filling the spaces to define second gate electrodes. The linear array of first and second gate electrodes is patterned such that the outermost gate electrodes are first gate electrodes. These embodiments of the present invention have an odd number of first and second gate electrodes in total.

In some embodiments of the present invention an odd number of first gate electrodes are formed. Where there is more than one first gate electrode, spaces between each first gate electrode are present. A second gate layer is deposited filling any spaces between multiple first gate electrodes. The linear array of first and second gate electrodes is patterned such that at least one outermost gate electrode is a second gate electrode. These embodiments of the present invention have an even number of first and second gate electrodes in total.

In some embodiments of the present invention, source and drain regions are formed in side-walls of trench isolation regions which define edges of an active area. In some embodiments of the present invention, the source and drain regions are formed self-aligned to the outermost edges of the linear array of first and second gate electrodes.

The plurality of gates in a multiple split gate transistor are individually controlled to perform many operations. For example, in some embodiments multiple split gate transistors enhance device control by independently controlling the multiple gates individually. In other embodiments, the multiple gate transistors are controlled to have a gate electrode modify the drain potential of a transistor. In still other embodiments, the multiple gate transistors allow independent bias of the main gate electrode and source/drain regions. Independently biasing the gate electrode and source/drain regions permits precise control of transistor performance to improve transistor reliability and enhance operating speed. The multiple split gate transistor is also advantageously employed in a stacked transistor structure such as the structure used in NAND gates by stacking N-channel transistors and the structure used in NOR gates by stacking P-channel transistors. The multiple split gate transistor approach to stacked transistors advantageously conserves integrate circuit area.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1A:
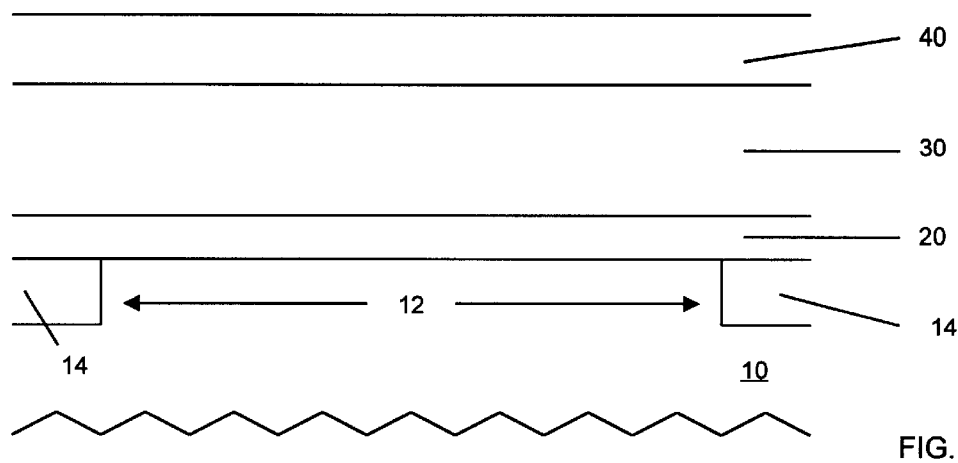
FIGS. 1A through 1K are simplified cross-sectional representations of a portion of an embodiment of the present invention at various stages of manufacture.

Embodiments of the present invention will be described with reference to the aforementioned figures. These drawings are simplified for ease of understanding and description of embodiments of the present invention only. Various modifications, adaptations or variations of specific methods and or structures may become apparent to those skilled in the art as embodiments of the present invention are described. All such modifications, adaptations or variations that rely upon the teachings of the present invention, and through which these teachings have advanced the art, are considered to be within the spirit and scope of the present invention. For example, while substrate 10 is shown with a minimum of detail for ease of understanding, it will be understood that typically substrate 10 is tailored to maximize the yield and performance of semiconductor circuitry formed therein. Therefore, while in some embodiments of the present invention substrate or wafer 10 can be a silicon wafer, as depicted in FIG. 1A, in other embodiments substrate 10 can have an epitaxial silicon layer disposed thereon and in still other embodiments substrate 10 can be a silicon bonded wafer structure such as used for fabrication of Silicon On Insulator (SOI) circuits. Thus, substrate 10 can be any structure known to those of ordinary skill in the art to be suitable for semiconductor device fabrication.

For ease of understanding and simplicity, common numbering of elements within the illustrations is employed where the element is the same between illustrations.

Referring now to FIG. 1A, a simplified cross-sectional representations of a portion of an embodiment of the present invention at an early stage in its manufacture is shown. A semiconductor substrate or wafer 10 has an active area 12 formed adjacent isolation regions 14. Substrate 10 and active area 12 are depicted without doped regions formed therein, but only for simplicity of illustration. The structure of substrate 10 and the presence of doped regions in or adjacent to active area 12 are not critical. Any known suitable structure or doped regions can be employed to tailor substrate 10 and active area 12 for the specific devices fabricated therein. For example, dopant for adjusting the threshold voltage of transistors that are subsequently formed are often implanted just prior to gate oxidation. Therefore, active area 12 includes one or more internal doped regions. Similarly, the specific form of isolation regions 14 are not critical. Therefore, while isolation regions 14 are depicted as formed using a Shallow Trench Isolation (STI) method, other isolation methods or structures can be employed. For example, a LOCalized Oxidation of Silicon (LOCOS) method is employed in some embodiments.

A gate oxide layer 20, a polysilicon layer 30, and an optional masking layer 40 are shown disposed overlying the substrate 10. Specifically, the gate oxide layer 20, polysilicon layer 30, and optional masking layer 40 are formed overlying the active area region 12 and isolation regions 14. Gate oxide layer 20 is typically a silicon oxide or silicon dioxide material which is formed by thermal oxidation of substrate 10 in a known manner. The gate oxide layer 20 typically has a thickness in the range of approximately 2 to 20 nanometers (nm). Other suitable thicknesses and/or materials may be used for gate oxide layer 20. The choice of thickness and/or material for gate oxide layer 20 is a design choice determined by circuit performance specifications. Polysilicon layer or first polysilicon layer 30 is formed having a thickness between approximately 50 to 300 nm employing a chemical vapor deposition (CVD) process. Other appropriate thicknesses may be used. The optional masking layer 40, when present, is formed from a material that is selectively etched with respect to the underlying first polysilicon layer 30. Examples of masking materials include silicon oxide, silicon nitride or silicon oxynitride. When a silicon nitride material is selected, a thickness of approximately 20 to 60 nm for layer 40 is suitable. Other thicknesses are also suitable.

Figure 1B:
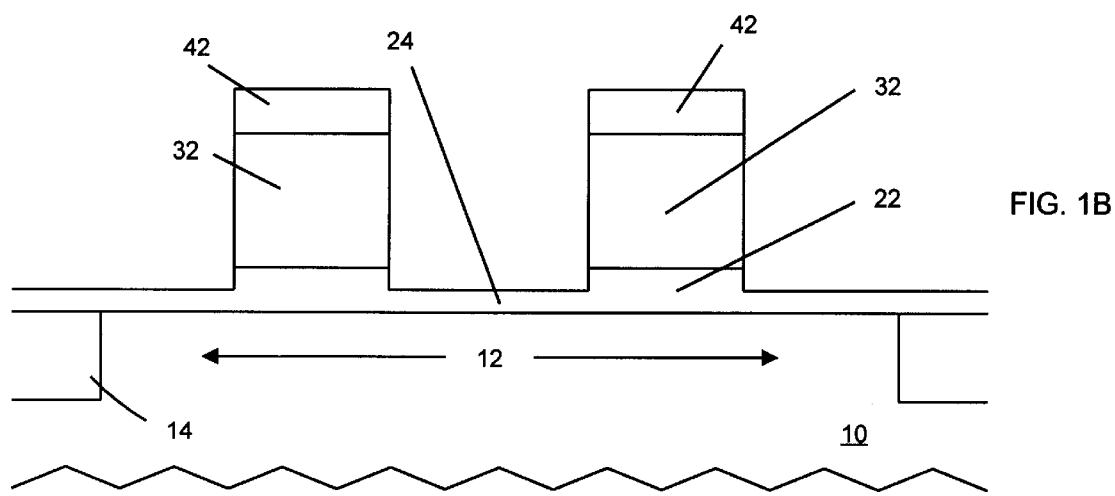

Referring to FIG. 1B, the structure of FIG. 1A is shown in a subsequent fabrication step of an embodiment of the illustrative method. Masking layer 40 and first polysilicon layer 30 are patterned and etched to form first polysilicon gates 32 with overlying masking portions 42 but exposing region 24 of gate oxide layer 20 adjacent polysilicon gates 32. First gates 32 and overlying masking portions 42 are formed by depositing and patterning a photoresist layer (not shown) to expose predetermined portions (not shown) of masking layer 40. The exposed portions of masking layer 40 and underlying layer 30 are then etched with a commonly used anisotropic etch processes for each material. For example, for a masking layer 40 composed of silicon nitride, an RIE etch employing $CF_4$ or $C_2F_6$ is suitable. Once masking layer 40 is patterned by an RIE etch using hydrogen bromide (HBr) to form polysilicon gates 32.

Typically, etching of first polysilicon layer 30 utilizes an over-etch period within the process to insure complete removal of all of first polysilicon layer 30 in the predetermined areas. The over-etch period removes some of the underlying gate oxide layer 20, reducing the gate oxide layer 20 thickness. While the exact amount of thickness reduction varies depending upon the length of the over-etch period and the specific etch process employed, a reduction of up to one-half the original thickness is typical. Thus, exposed gate oxide layer 20 is reduced in thickness in region 24 in comparison to regions 22 of gate oxide layer 20 underlying first gates 32. Once first polysilicon gates 32 and masking portions 42 are defined, any of several common channel tailoring implants (not shown) are performed to adjust doping of specific regions within active area 12. Where optional masking layer 40 is not used, portions 42 are not formed and first polysilicon layer 30 is etched to form first polysilicon gates 32 directly. The residual gate oxide is optionally removed.

Figure 1C:
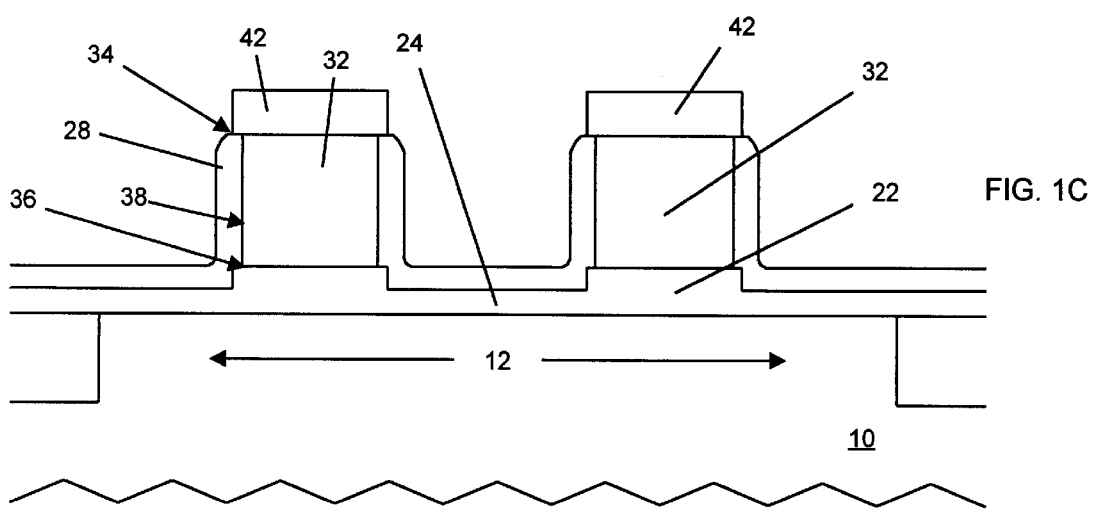

FIG. 1C illustrates the structure of FIG. 1B following a thermal oxidation process in which a gate insulating layer 28, which is adjacent to side-walls 38 of first gates 32, is formed. Insulating layer 28 is formed by the oxidation of a portion of polysilicon gates 32 at side-walls 38. Where masking portions 42 are employed, essentially no oxidation of first gates 32 occurs underlying portions 42, although some bird's beak formation can occur at interface 34. Typically gate insulating layer 28 is selectively deposited to a thickness of approximately 10 nm to 50 nm. Other suitable thicknesses may be employed. The width of gates 32 is reduced by an amount consistent with the selected thickness of layer 28.

Thermal oxidation to form layer 28 also increases the thickness of exposed gate oxide layer 20 in region 24. If the residual gate oxide is previously removed, a suitable thickness of the gate oxide layer 20 is grown in a range from approximately 2 nm to 200 nm. After thermal oxidation, gate oxide layer 20 has an increased thickness in region 24 in comparison to regions 22. In addition, bird's beak formation (not shown) can occur at interface 36. When masking portions 42 are not employed, gate insulating layer 28 also forms adjacent the upper surface of first polysilicon gates 32 (not shown) and, due to geometrical effects, some breadloafing or enhanced oxidation (not shown) can occur at the corner of the first polysilicon gate 32 adjacent the upper surface.

The increase in thickness of gate oxide layer 20 in regions 24 results from oxidizing the underlying single crystal silicon of active area 12 and is less than the thickness of gate insulating layer 28. In contrast, the gate insulating layer 28 has a greater thickness since the gate insulating layer 28 is formed by oxidizing polysilicon of first gates 32 and polysilicon oxidizes at a higher rate than single crystal silicon. In some embodiments, the oxidation is controlled to increase the thickness of gate oxide layer 20 in region 24 to a specific predetermined target value. In other embodiments, the oxidation is controlled to form a specific thickness of gate insulating layer 28. Layer 28 supplies insulation and separation. A thickness of layer 28 that is sufficient to provide suitable insulation and separation is an appropriate thickness. Some regions 24 underlie gate electrodes that are be formed in subsequent steps so that a thickness suitable for achieving desired transistor characteristics is suitable.

In other embodiments of the structure shown in FIG. 1C, gate insulating layer 28 is formed by depositing a conformal layer (not shown) of insulating material overlying first polysilicon gates 32 and exposed gate oxide regions 24 followed by an etch-back process. For example, a silicon oxide layer is formed using a Plasma Enhanced CVD (PECVD) process and subsequently etched-back using an RIE process. In this manner, gate insulating layer 28 is formed from a portion of the conformal layer of insulating material adjacent side-walls 38 of first gates 32 and is functionally employed as a spacer 28 for self-aligned implants into the substrate 10. When spacers 28 are formed by a deposition and etch-back process, no increase in the thickness of gate oxide layer 20 in region 24 results. Therefore, a subsequent thermal oxidation is used to increase the thickness in region 24, where desired. In this manner, the thickness of insulating layer or spacer 28 and gate oxide layer 20 in region 24 is independently tailored.

Figure 1D:
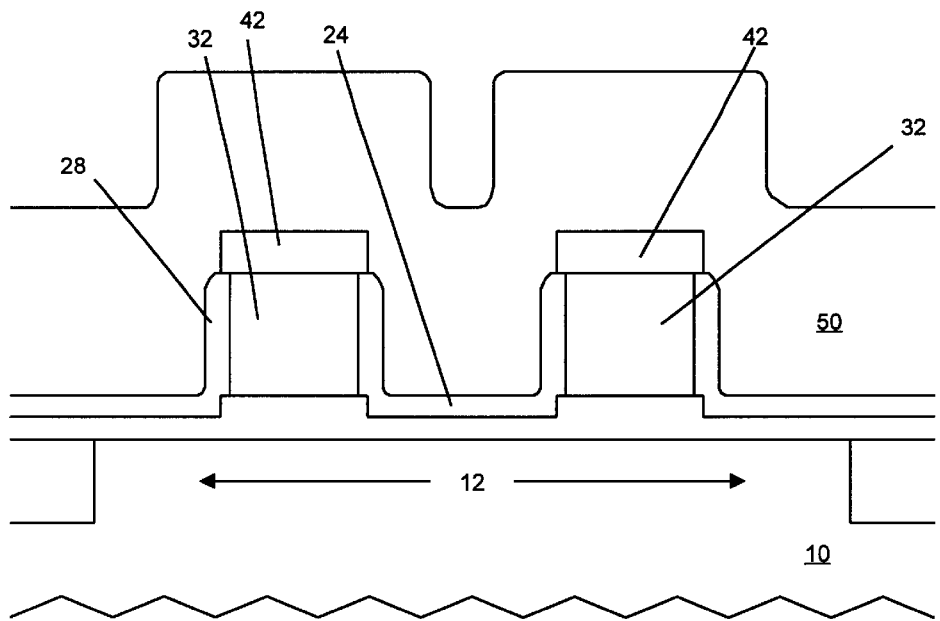

Referring to FIG. 1D, the structure of FIG. 1C is depicted following deposition of a second polysilicon or second polysilicon layer 50 overlying substrate 10 and specifically overlying first polysilicon gates 32, masking regions 42, and the exposed gate region 24. The second polysilicon layer 50 is deposited in a manner consistent with the process for forming polysilicon layer 30 and has a thickness slightly greater than that of polysilicon layer 30. Exposed gate region 24 adjacent to both first gates 32 is completely filled with the second polysilicon layer 50. The polysilicon layer 50 extends above regions 42. In method embodiments that do not use the optional layer 40, the layer 28 is formed not only on the side-walls 38 but also on the top surfaces of the first gates 32. In these embodiments the second polysilicon layer 50 abuts and is separated from the first gates 32 by the upper portion of layer 28 in the manner that the second polysilicon layer 50 is separated from the first gates 32 by the masking regions 42.

Figure 1E:
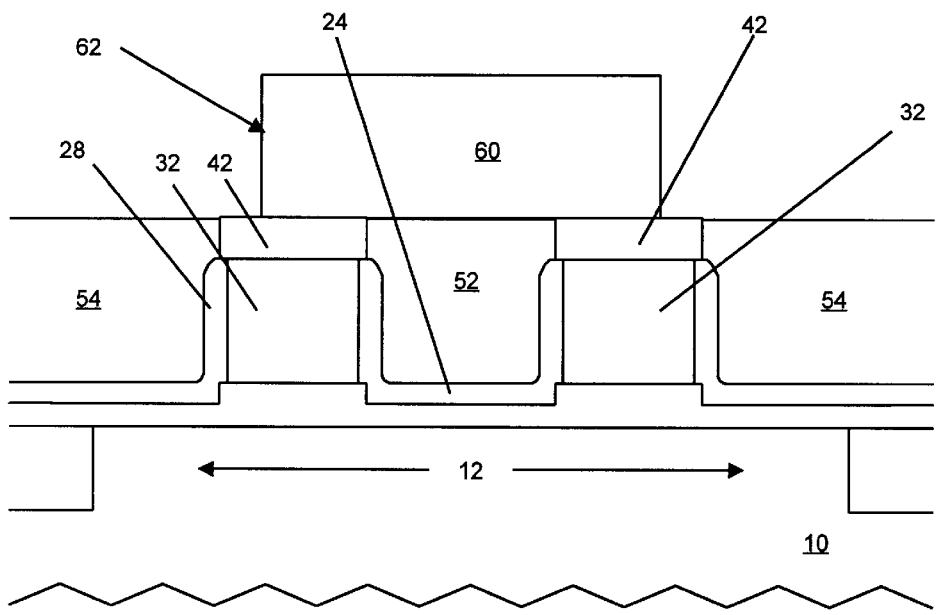

In FIG. 1E, the structure of FIG. 1D is shown following planarization of the second polysilicon layer 50. The second polysilicon layer 50 is typically planarized using Chemical Mechanical Polishing (CMP) techniques in which optional masking portions 42 serve as a polish-stop layer. When optional portions 42 are not used, upper portions of layer 28 serve as a polish-stop layer. CMP techniques are employed to planarize the second polysilicon layer 50 to the level of portions 42 or upper portions of layer 28 (not shown). Once layer 50 is planarized, a photoresist layer 60 is deposited over the planarized surface and patterned to form lateral edges 62 overlying the first polysilicon gates 32. Exposed portions 54 of second polysilicon layer 50 are removed using a commonly employed polysilicon etch processes, such as the techniques described for etching polysilicon layer 30.

Figure 1F:
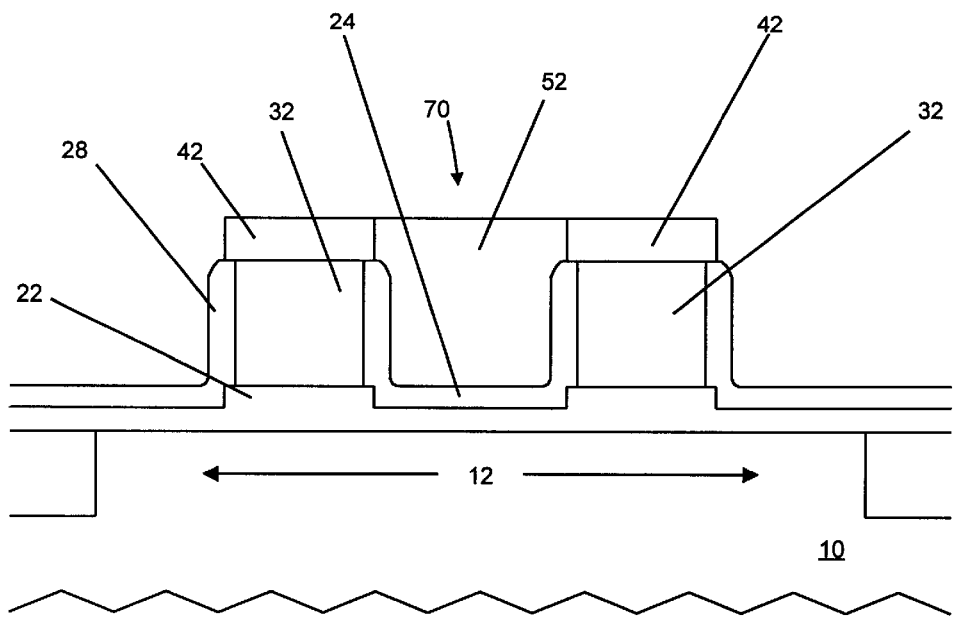

FIG. 1F depicts the structure of FIG. 1E upon completion of the etching of second polysilicon layer 50, leaving an inner polysilicon gate 52, and removal of the photoresist layer 60. A multiple gate structure 70 is shown having a pair of outer gates 32 formed from first polysilicon layer 30 and an inner gate 52 formed from second polysilicon layer 50. The gate width for gate 52 is defined by the space between adjacent first gates 32 and thus determined by the width of the space less twice the thickness of gate insulating layer 28. Advantageously, the width and positioning of gate 52 are inherently set by the configuration of the first gates 32 and not determined by patterning of the photoresist layer 60 or etching of the polysilicon layer 50 so that high precision in the patterning and etching operations, which is difficult to achieve, is unnecessary.

FIG. 1F depicts a multiple gate structure 70 having three gates of approximately the same width. The multiple gate structure 70 is illustrative only. Other multiple gate structures 70 are possible having other numbers of gates and other gate widths. For example, the method described with respect to FIGS. 1A–1K may be used to form a multiple gate structure (not shown) having five gates, each gate having a different width. In addition, as channel tailoring implants can be performed for each gate individually or for first and second gates as groups, each of the five first and second gates can control channel regions having different characteristics, if so desired.

Figure 1G:
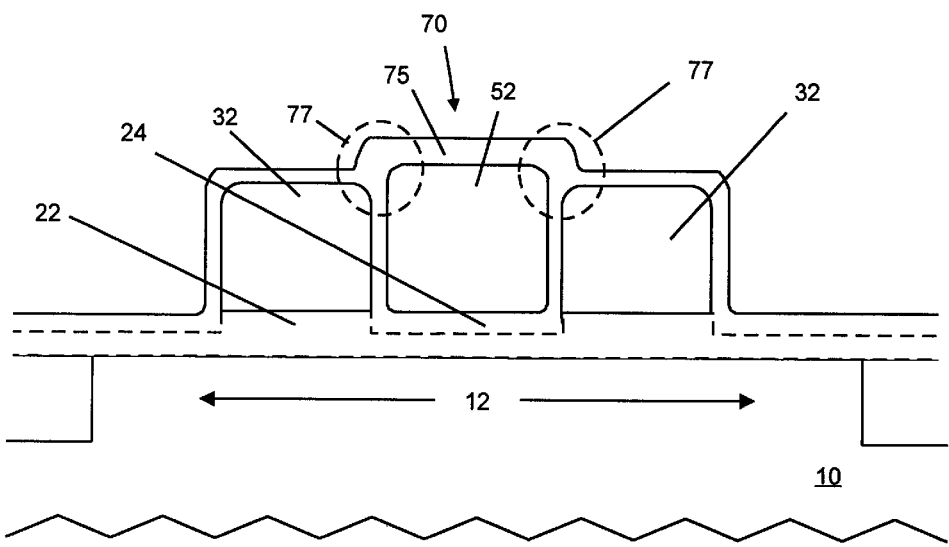

Referring to FIG. 1G, the multiple split gate structure 70 is shown following removal of the masking portions 42 and formation of a silicon dioxide (oxide) layer 75. The top surfaces of the first gates 32 are exposed by removing the masking portions 42. In embodiments that do not utilize the masking portions 42, the top surface of the first gates 32 are exposed, if desired, by removing the oxide layer 28 overlying the first gates 32. In some embodiments, the oxide layer 28 on the lateral side-walls and top surface of the first gates 32 and other exposed oxide regions are removed and, in the locations of oxide removal, a metal is optionally reacted to form a silicide or salicide layer prior to formation of the oxide layer 75.

Following removal of the masking portions 42, the top surfaces of the first gates 32 and an uppermost portion of the inner gate 52 are oxidized to form the oxide layer 75. In the illustrative embodiment, the inner gate 52 extends beyond the first gates 32 so that a larger region of oxidation is formed overlying the inner gate and enhanced oxidation occurs within regions 77 at the intersection of the top surfaces of the first gates 32 and the inner gate 52. The enhanced oxidation in the regions 77 increases the separation between the outer gates 32 and the inner gate 52. Typically oxide layer 75 forms all or a portion of a contact dielectric layer. FIG. 1G depicts the dielectric layer 75 as a single film, however in most embodiments a multilayer film is employed. For example, the dielectric layer 75 is formed using an initial thermal oxidation and the oxide thickness is subsequently increased using a deposition step such as a CVD oxide deposition. In some embodiments, the initial thermal oxidation is omitted and only a CVD or PECVD oxide layer is formed.

Figure 1H:
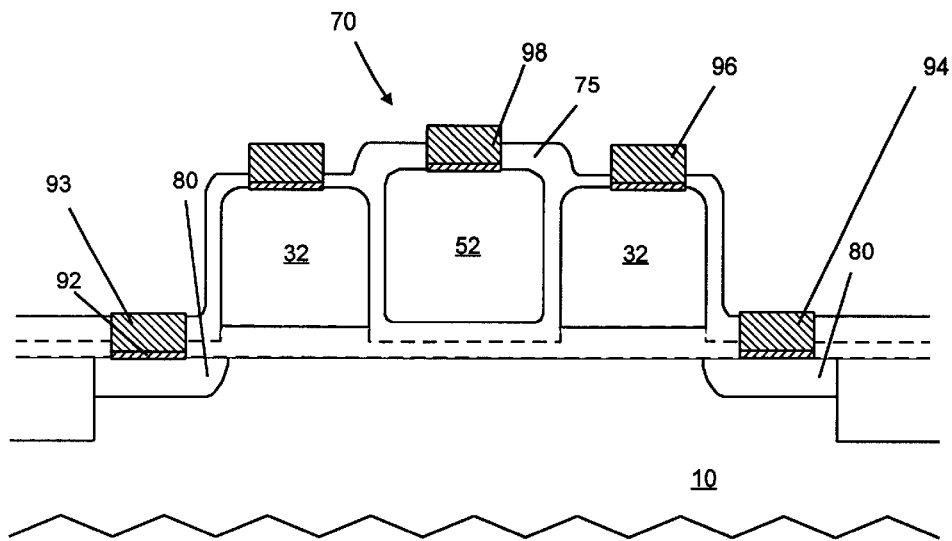

FIG. 1H shows structure 70 after source-drain (S/D) regions 80 have been formed, layer 75 patterned to expose upper surfaces of S/D regions 80, outer polysilicon gates 32 and polysilicon gate 52. In some embodiments, selected dopants are implanted into source/drain regions, channel regions, and LDD implant regions in the active area 12 in conventional positions, concentrations, and implant energies. S/D contact metallizations 94, outer gate contact metallizations 96, and inner gate contact metallization 98 are shown formed each exposed surface, respectively. Patterning of layer 75 is performed using known photolithographic and etch processes to expose the underlying surfaces. Each contact metallization is depicted as having a silicide or salicide layer 92 with an overlying metal layer 93 such as a tungsten (W) layer. A titanium (Ti) silicide process is suitable for forming silicide layers 92 although other metals that react with silicon to form a silicide are alternatively used. In addition, a deposited metal silicide process can be employed where desired. Thus the actual metallization process used to form contact metallizations 94, 96 and 98 is a design choice, and any such choice is within the scope and spirit of the present invention.

In addition, S/D regions 80 can have lightly doped enhancement (LDD) regions (not shown) self-aligned to first polysilicon gates 32 and spacers (not shown). Formation of spacers and LDD regions can be accomplished using any of the known methods commonly employed. For example, LDD regions can be formed by ion implantation of a dopant at a first dose into portions of active area 12 not underlying gates 32 and 52. Spacers can be formed adjacent gates 32 and a second implant at a second dose, higher than the first dose, performed to complete the doping of S/D regions 80. As described with respect to contact metallizations the specific structure of S/D regions 80 is a design choice. Thus, for example, some embodiments can have regions 80 with LDD regions therein and other embodiments can have S/D regions 80 without LDD regions therein.

In an illustrative embodiment, the contact metallizations 94, 96, and 98 are formed by first depositing a titanium sacrificial barrier (not shown) into the contact vias 84 in contact with the silicide layers 92. Titanium films are used as a diffusion barrier since titanium (Ti) is an oxygen-gettering material and oxide-reducing agent. Accordingly, titanium dissolves a native oxide layer on the silicon surface of the substrate or polysilicon gate during annealing and adheres well to both silicon and oxide ($SiO_2$). In addition, titanium forms good ohmic contacts to heavily-doped silicon whether the doping is N-type doping or P-type doping. The illustrative structure advantageously facilitates circuit arrangements in which the sources of two or more transistors are connected.

In the illustrative embodiment, the contact metallizations 94, 96, and 98 form a tungsten (W) interconnect. The titanium sacrificial barrier between the polysilicon of the source, drain, and gate regions and the tungsten contact metallizations 94, 96, and 98 function as a sacrificial barrier through the reaction of titanium with silicon to form titanium silicide. The titanium sacrificial barrier is formed by depositing a very thin layer of titanium onto the substrate or polysilicon including deposition into the contact vias 84. The substrate or polysilicon is annealed to react the titanium with the silicon in the undoped polysilicon, thereby forming $TiSi_2$. The titanium is deposited as a very thin layer to avoid absorption of dopants from undoped polysilicon during formation of $TiSi_2$.

Following the formation of the titanium sacrificial barrier, a titanium nitride (TiN) passive barrier (not shown) is formed over the titanium sacrificial barrier. The TiN passive barrier serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier is formed using one of multiple techniques. For example, the TiN passive barrier is formed by: (1) evaporating titanium in a nitrogen ($N_2$) ambient, (2) reactively sputtering the titanium in an argon (Ar)-nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten contact metallizations 94, 96, and 98 are formed by chemical vapor deposition (CVD) of tungsten in a low pressure CVD reactor. Typically tungsten hexafluoride $WF_6$ is used as a source gas for reduction by hydrogen or silicon in a two-step process. In a first step, the tungsten source is reduced by silicon, typically from silane ($SiH_4$) or dichlorosilane ($SiH_2Cl_2$) to form a layer of tungsten approximately 100 Å thick. In a second step, hydrogen $H_2$ reduction is performed to deposit additional tungsten only on the tungsten layer formed in the first step. The contact metallizations 94, 96, and 98 are formed in the contact vias 84 over the titanium sacrificial barrier and the TiN passive barrier by silicon reduction of tungsten hexafluoride $WF_6$, leaving solid tungsten, silicon fluoride vapor, and sometimes hydrogen fluoride vapor.

Figure 1I:
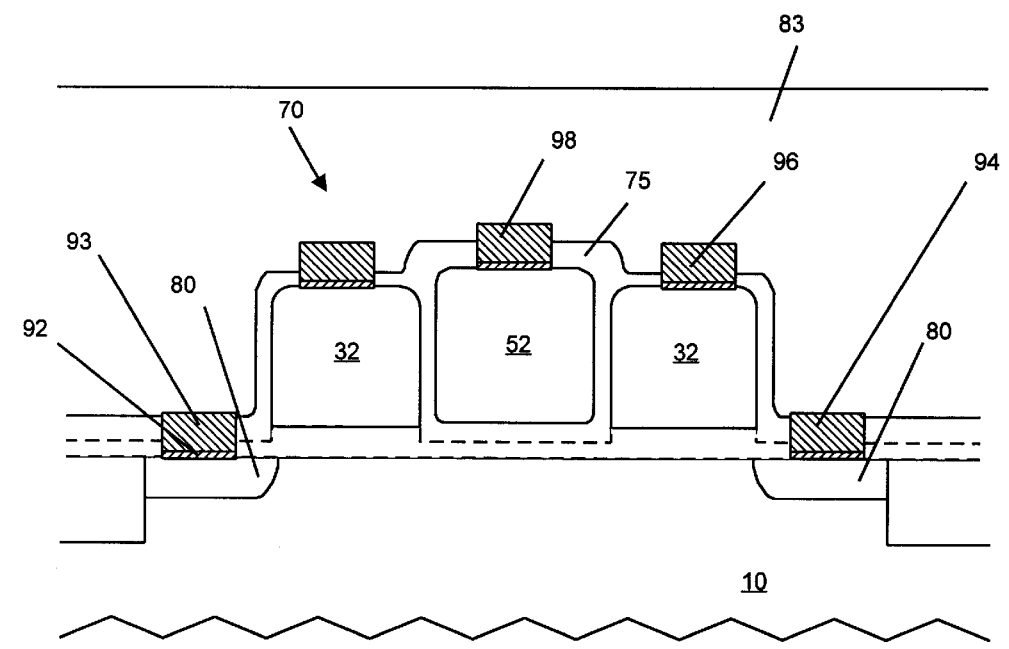

Referring to FIG. 1I, a blanket layer of silicon oxide ($SiO_2$) 83 is formed over the substrate 10, covering the gate oxide layer 20 and spacers 28 of the semiconductor device. The oxide layer 83 with a thickness in the range of 5000 Å to 20000 Å is conformally deposited over the substrate 10 by chemical vapor deposition (CVD), generally a low-pressure chemical vapor deposition (LPCVD) or a plasma-enhanced chemical vapor deposition (PECVD) process, at a temperature in the range of 300° C. to 400° C. The oxide layer 83 is subsequently chemical mechanical polished (CMP) to planarize the oxide layer surface.

Figure 1J:
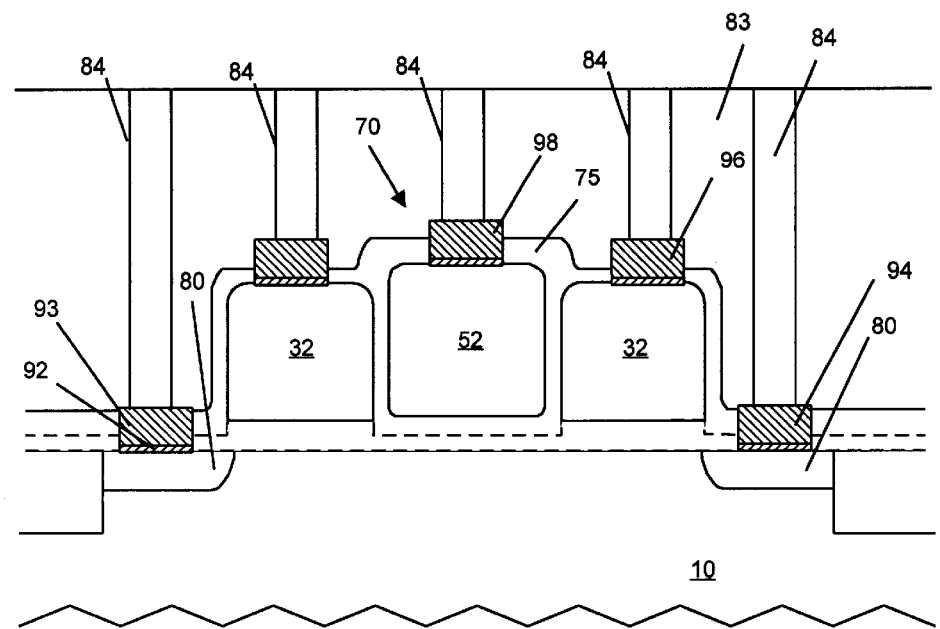

Referring to FIG. 1J, a contact via-defining photoresist mask is patterned over the oxide layer 83. The contact via-defining photoresist mask is deposited in a continuous layer on the oxide layer 83 and irradiated using the photolithographic system to form a predefined two-dimensional image pattern on the horizontal planar surface of the oxide layer 83. The contact via-defining photoresist mask defines a plurality of contact vias 84 for accessing and making electrical connections to selected regions of the semiconductor device through the oxide layer 83. In the illustrative embodiment, contact vias 84 are made for contacting the first gates 32, the inner gate 52, and the S/D regions 80 from an interconnect layer (not shown). The contact via-defining photoresist mask is developed and irradiated portions of the mask are removed to expose the oxide layer 83 overlying the prospective locations of the contact vias 84. In the illustrative embodiment, the contact via-defining photoresist mask forms some contact vias 84 extending essentially across that lateral dimension of the outer gate contact metallizations 96, the inner gate contact metallization 98, and other contact vias extending over a portion of the S/D contact metallizations 94.

The oxide layer 83 is etched using a reactive ion etch (RIE) that etches the contact vias 84 to the surface of the substrate 10. The reactive ion etch (RIE) etches the oxide layer 83 and portions of the spacers 28 that are exposed by the contact via-defining photoresist mask.

Figure 1K:
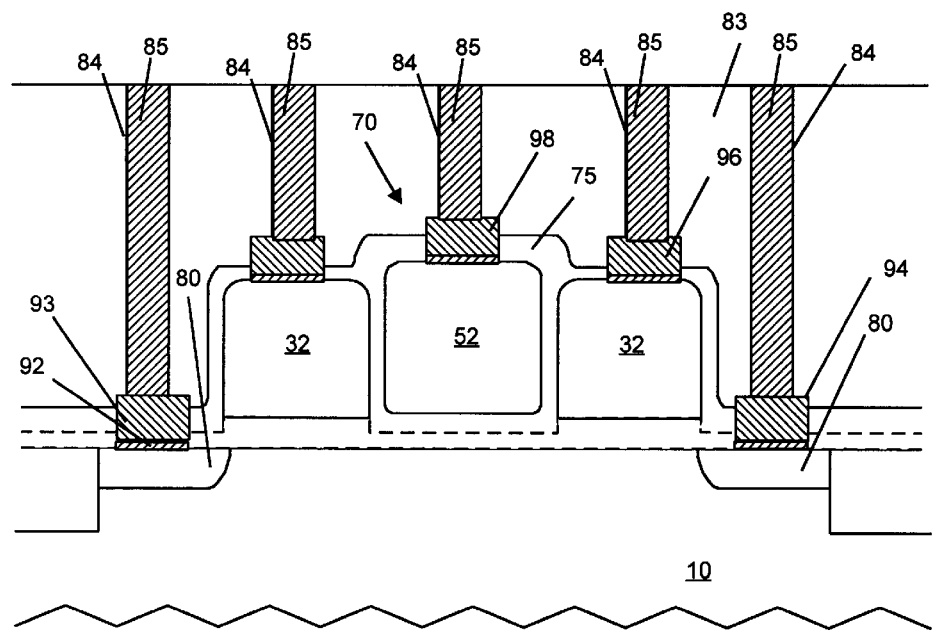

Referring to FIG. 1K, metal interconnects 85 form electrical connections to the first gates 32 via the outer gate contact metallizations 96, the inner gate 52 via the inner gate contact metallization 98, and the S/D regions 80 via the S/D contact metallizations 94 with the metal interconnects 85, the outer gate contact metallizations 96, the inner gate contact metallization 98, and the S/D contact metallizations 94 serving as conductors. The metal interconnects 85 are connected to interconnect structures (not shown) in an interconnect layer overlying the oxide layer 83 to form a connection to an interconnect structure selectively connecting multiple transistors including biasing connections to the first gates 32, the inner gate 52, and the S/D regions 80.

Once the metal interconnects 85 are formed, chemical-mechanical polishing (CMP) is used to planarize the surface overlying the substrate 10. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid.

The metal interconnects 85 may be formed of metals other than tungsten. Tungsten advantageously tolerates high temperatures that occur during annealing.

The enhanced oxidation within region 77 shown in FIG. 1G is advantageously employed to reduce the possibility of bridging between individual gate contacts 94, 96 and 98 during a salicide step by increasing the spacing between gate electrodes in region 77, beyond that of the as formed thickness of layer 28.

Thus, a multiple split gate semiconductor device (MSGSD) and methods of forming have been demonstrated. MSGSD advantageously has gates formed from a first and a second layer of polysilicon wherein gate widths are essentially fixed by formation of the first gates. Additionally, MSGSD has at least a first and last gate of any linear array of multiple split gates formed from the first gates resulting in a device wherein the total number of gates is an odd number. In this manner, patterning of the second gates can be performed without the need for a critical masking step or etching process. Each gate is electrically insulated from adjacent gates using an insulating layer formed adjacent side-walls of the first gates. The insulating layer is advantageously formed to have a thickness at an upper surface of the gates sufficient to allow for salicide gate contacts.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A multiple split gate transistor of an integrated circuit comprising:
    a substrate wafer having an active region laterally enclosed within an isolation region;
    a gate insulating layer formed on a surface of the substrate wafer overlying the active region and the isolation region; and
    a plurality of gate electrodes overlying the active region, the individual gate electrodes being laterally bounded and isolated by an insulating dielectric layer mutually abutting and overlying adjacent gate electrodes and having an enhanced oxidation region at adjacent upper corners of the adjacent gate electrodes enhancing isolation of the adjacent gate electrodes; of said multiple split gate transistor.

2. An integrated circuit according to claim 1, wherein:
    the plurality of gate electrodes include a first lateral edge gate electrode and a second lateral edge gate electrode;
    the integrated circuit further including:
    a lightly-doped drain region doped into the active region self-aligned with the first lateral edge gate electrode and the second lateral edge gate electrode.

3. An integrated circuit according to claim 2, further comprising:
- a first spacer formed on a lateral sidewall surface of the first lateral edge gate electrode opposite the second lateral edge gate electrode;
- a second spacer formed on a lateral sidewall surface of the second lateral edge gate electrode opposite the first lateral edge gate electrode; and
- a source/drain region doped into the active region self-aligned with the plurality of gate electrodes, the first spacer and the second spacer.

4. An integrated circuit according to claim 3, wherein:
the source/drain region has a doping concentration higher than the lightly-doped drain region.

5. An integrated circuit according to claim 1, further comprising:
- a silicide layer formed on an upper surface of a gate electrode of the plurality of gate electrodes.

6. An integrated circuit according to claim 1, further comprising:
- a plurality of silicide layers formed on upper surfaces of the gate electrodes;
- an insulating layer formed on the substrate wafer overlying the plurality of gate electrodes, the insulating layer having a via extending through the insulating layer to the gate electrode and vias extending through the insulating layer to the spacers; and
- a plurality of conductors formed in the vias extending through the insulating layer.

7. The integrated circuit of claim 1, wherein said insulating dielectric sidewalls are substantially perpendicular to the surface of the substrate wafer.

8. A multiple split gate transistor of a semiconductor integrated circuit comprising:
- a semiconductor substrate having an upper surface;
- an active area region formed adjacent to the upper surface;
- an isolation region formed in the semiconductor substrate wherein boundaries of the active area region are defined by the isolation region;
- a first gate electrode formed overlying a portion of the active area region, wherein the first gate electrode is formed from a first polysilicon layer;
- a gate insulating layer formed adjacent each side-wall and overlying the first gate electrode;
- at least one second gate electrode, formed from a second polysilicon layer, positioned adjacent the first gate electrode, wherein the second gate electrode is electrically isolated from the first gate electrode by the gate insulating layer, the gate insulating layer having an enhanced oxidation region at adjacent upper corners of the first gate electrode and at least one second gate electrodes enhancing isolation of the first and at least one second gate electrodes; and
- a pair of doped regions formed within the active area region, wherein each of the doped regions is adjacent an edge of a first gate electrode or an edge of a second gate electrode, and wherein a channel region disposed between the pair of doped regions and underlying the first and second gate electrodes is formed; of said multiple split gate transistor.

9. The semiconductor integrated circuit of claim 8 having an odd number of gate electrodes.

* * * * *